(12) United States Patent
Yokote et al.

(10) Patent No.: US 8,698,964 B2
(45) Date of Patent: Apr. 15, 2014

(54) TELEVISION APPARATUS, ELECTRONIC DEVICE, AND SLIDE SUPPORT MECHANISM

(75) Inventors: Satoshi Yokote, Ome (JP); Yoshihiko Shinozaki, Ome (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 329 days.

(21) Appl. No.: 12/960,161

(22) Filed: Dec. 3, 2010

(65) Prior Publication Data
US 2011/0267551 A1    Nov. 3, 2011

(30) Foreign Application Priority Data

Apr. 30, 2010    (JP) .................................. 2010-105777

(51) Int. Cl.
*H04N 5/64*    (2006.01)

(52) U.S. Cl.
USPC .......................................... 348/836; 348/739

(58) Field of Classification Search
USPC .......................................................... 348/836
See application file for complete search history.

(56) References Cited

U.S. PATENT DOCUMENTS

| | | | |
|---|---|---|---|
| 5,887,959 A * | 3/1999 | Yuri ................. | 312/7.2 |
| 7,579,758 B2 | 8/2009 | Maruyama et al. | |
| 2008/0122315 A1 | 5/2008 | Maruyama et al. | |
| 2009/0174825 A1 * | 7/2009 | Yee et al. ........................ | 348/801 |

FOREIGN PATENT DOCUMENTS

| | | |
|---|---|---|
| JP | HEI 09-161602 A | 6/1997 |
| JP | 2000-222128 | 8/2000 |
| JP | 2002-175151 A | 6/2002 |
| JP | 2007-026344 A | 2/2007 |
| JP | 2008-046817 A | 2/2008 |
| JP | 2008-123453 | 5/2008 |

OTHER PUBLICATIONS

Information Sheet.
Notice of Reasons for Rejection mailed by the Japan Patent Office on Jun. 21, 2011 in corresponding Japanese patent app. No. 2010-105777 in 5 pages.

* cited by examiner

*Primary Examiner* — Dave Czekaj
*Assistant Examiner* — Kristin Dobbs
(74) *Attorney, Agent, or Firm* — Knobbe Martens Olson & Bear LLP

(57) ABSTRACT

According to one embodiment, a television apparatus includes a panel unit, a support base, and a plurality of slide support mechanisms. The panel unit includes a front panel arranged in front of a display panel. The support base supports the display panel. The slide support mechanisms are attached to the support base to slidably support the panel unit. The slide support mechanisms includes an elastic bush and a combined member. A through portion is formed in the elastic bush. The elastic bush has a circumference portion attached to one of the support base and the panel unit. The combined member is combined with the other of the panel unit and the support base via a combining portion passing through the through portion, and holds the elastic bush with the other of the panel unit and the support base.

9 Claims, 8 Drawing Sheets

TELEVISION APPARATUS, ELECTRONIC DEVICE, AND SLIDE SUPPORT MECHANISM

CROSS-REFERENCE TO RELATED APPLICATIONS

This application is based upon and claims the benefit of priority from Japanese Patent Application No. 2010-105777, filed Apr. 30, 2010, the entire contents of which are incorporated herein by reference.

FIELD

Embodiments described herein relate generally to a television apparatus, an electronic device, and a slide support mechanism.

BACKGROUND

There have been known electronic devices in which a screen protector in front of the display panel is supported by the housing through a ring-like insulator arranged along the periphery of the screen protector.

In such an electronic device, the screen protector is supported by the housing through the ring-like insulator arranged along the entire periphery of the screen protector, and therefore hardly slides (vibrates).

BRIEF DESCRIPTION OF THE SEVERAL VIEWS OF THE DRAWINGS

A general architecture that implements the various features of the invention will now be described with reference to the drawings. The drawings and the associated descriptions are provided to illustrate embodiments of the invention and not to limit the scope of the invention.

DETAILED DESCRIPTION

Figure 1:
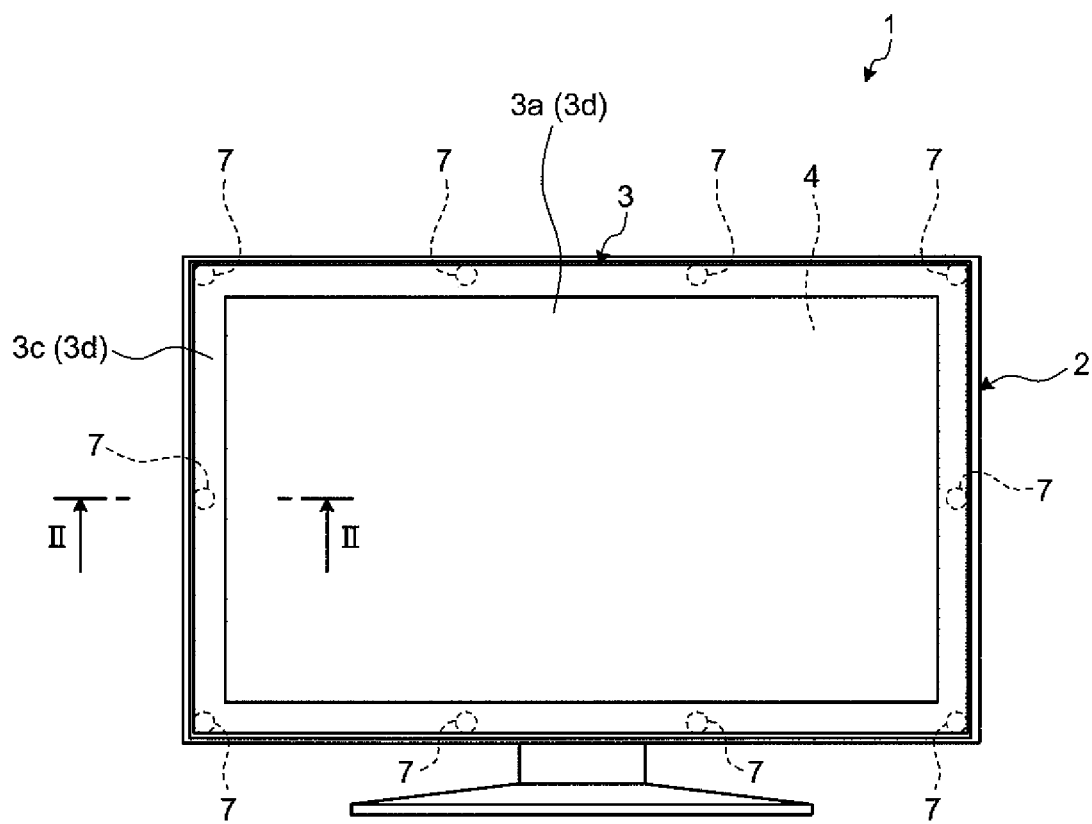
FIG. 1 is an exemplary front view of a television apparatus according to a first embodiment.

Various embodiments will be described hereinafter with reference to the accompanying drawings. In general, according to one embodiment, a television apparatus comprises a panel unit, a support base, and a plurality of slide support mechanisms. The panel unit comprises a front panel configured to be arranged in front of a display panel. The support base is configured to support the display panel. The slide support mechanisms are configured to be attached to the support base to slidably support the panel unit. The slide support mechanisms comprise an elastic bush and a combined member. A through portion is formed in the elastic bush. The elastic bush has a circumference portion attached to either the support base or the panel unit. The combined member is configured to be combined with either the panel unit or the support base via a combining portion passing through the through portion, and hold the elastic bush with either the panel unit or the support base.

According to still another embodiment, an electronic device comprises a panel unit, a support base, a plurality of slide support mechanisms. The panel unit comprises a front panel configured to be arranged in front of a display panel. The support base is configured to support the display panel. The slide support mechanisms are configured to be attached to the support base to slidably support the panel unit. The slide support mechanisms comprise an elastic bush and a combined member. A through portion is formed in the elastic bush. The elastic bush has a circumference portion fitted in either the support base or the panel unit. The combined member is configured to be combined with either the panel unit or the support base via a combining portion passing through the through portion, and hold the elastic bush with either the panel unit or the support base.

According to still another embodiment, an electronic device comprises a supporting member, a display module, a panel unit, a combining mechanism, and a preventing member. The display module is provided to the supporting member and comprises a display screen. The panel unit comprises a panel configured to cover the display screen. The combining mechanism is configured to combine the supporting member with the panel unit such that the panel unit is supported displacably with respect to the supporting member. The preventing member is located between the panel unit and the supporting member and is configured to suppress displacement of the panel unit with respect to the supporting member.

According to still another embodiment, a slide support mechanism comprises a base, a supported member, an elastic bush, a combining portion, and a combined member. The base is provided to a support base. The supported member is provided to a side of a supported body. A through portion is formed in the elastic bush. The elastic bush is configured to be supported by the base on a side of the through portion. The combining portion is configured to protrude from the supported member and pass through the through portion. The combined member comprises a head and a male screw portion threadedly engaged with a female screw portion provided to the combining portion. The base is located between the head and the supported member. The elastic bush is configured to be held between the head and the supported member. The supported member is slidably supported.

Figure 2:
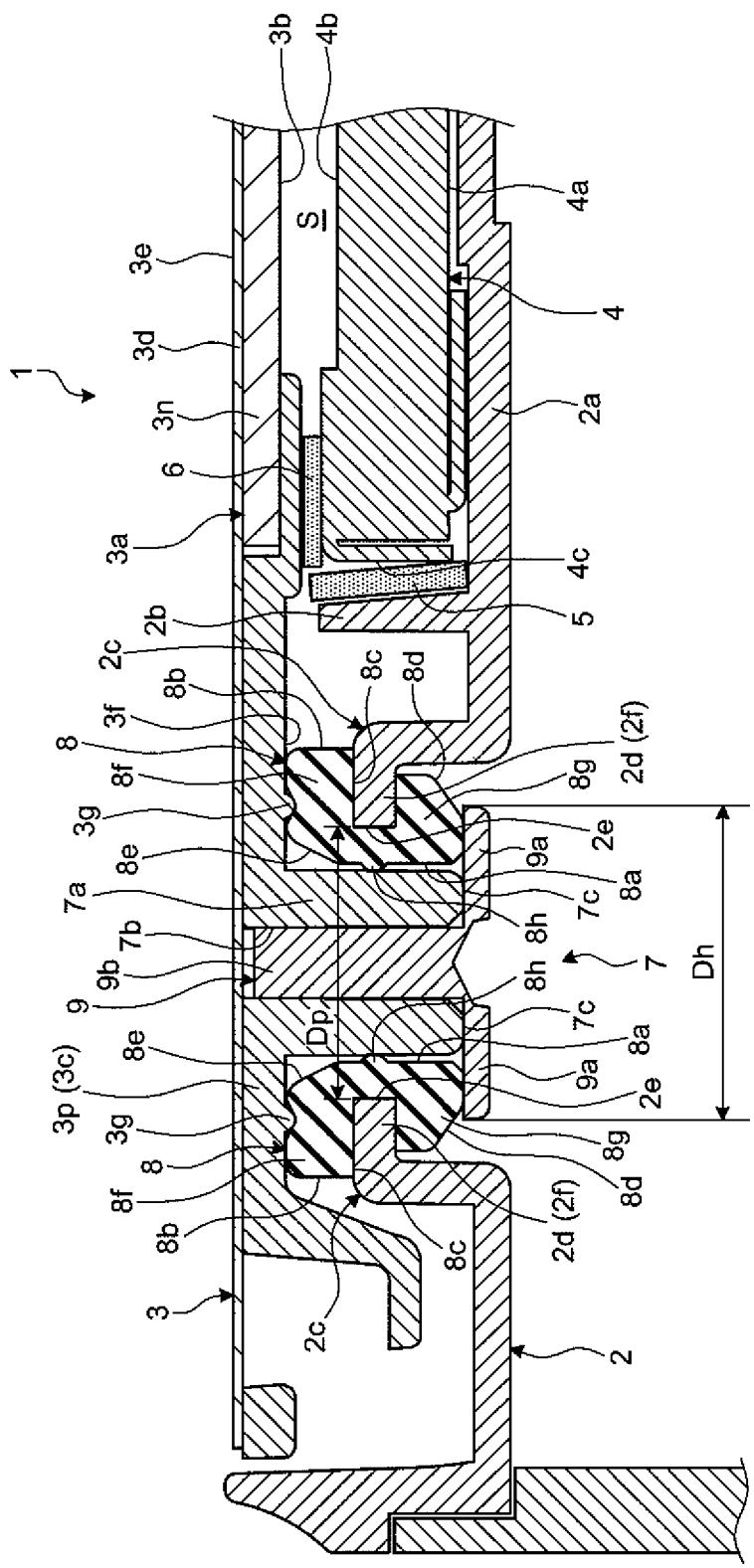
FIG. 2 is an exemplary cross-sectional view taken along line II-II of FIG. 1 in the first embodiment.

As illustrated in FIG. 1, a television apparatus 1 according to a first embodiment has a rectangular appearance in a front view (a plan view viewed from the front). The television apparatus 1 comprises a housing 2 and a touch panel 3a slidably supported by the housing 2. As illustrated in FIG. 2, the touch panel 3a has a back surface 3b. On the side of the back surface 3b (lower side in FIG. 2), a display panel 4 such as a liquid crystal display (LCD) panel is located as a display device. The display panel 4 has a back surface 4a. On the side of the back surface 4a, the housing 2 is located. The display panel 4 is fixed to the housing 2 by a screw (not illustrated) or the like. In the first embodiment, the touch panel 3a corresponds to a front panel (a panel unit), while the housing 2 corresponds to a support base (supporting member).

As illustrated in FIGS. 1 and 2, a rectangular frame 3c are arranged along the periphery of the rectangular sheet-like touch panel 3a. The frame 3c is made of a synthetic resin material, a metal material, or the like. The touch panel 3a and the frame 3c are attached to a transparent cover 3d by double-sided tape (not illustrated), adhesive, or the like. The cover 3d is made of a thin sheet-like, film-like, or plate-like synthetic resin material or the like. Through the cover 3d, the touch panel 3a is integrated with the frame 3c. A periphery 3n of the touch panel 3a is located between the frame 3c and the cover 3d. The periphery of the cover 3d is painted black or the like, and prevents the periphery 3n of the touch panel 3a and the frame 3c from being exposed on the side of a front surface 3e of a touch panel unit 3 (upper side in FIG. 2). In the first embodiment, the touch panel unit 3, as a panel unit, comprises the touch panel 3a, the frame 3c, and the cover 3d.

As illustrated in FIG. 2, the housing 2 comprises a rectangular plate-like bottom wall 2a and a plurality of vertical walls 2b. The display panel 4 is mounted on the bottom wall 2a. The vertical walls 2b extend from the bottom wall 2a toward the front side (upper side in FIG. 2) and face a side surface 4c of the display panel 4. In the first embodiment, the vertical walls 2b are arranged partly spaced apart along the periphery (the side surface 4c) of the display panel 4. The vertical walls 2b function as a positioning member to attach the display panel 9 to the housing 2 or a shock or energy absorbing member for a shock load acting in the horizontal direction (the left-right direction in FIG. 2) on the display panel 4 and the like. An elastic member 5 such as elastomer, sponge, or the like is located between the side surface 4c of the display panel 4 and the vertical walls 2b. The elastic member 5 prevents the shaky movement of the display panel 4 as well as increasing energy absorbing performance.

The display panel 4 is formed into a flat rectangular parallelepiped shape. The display panel 4 receives a video signal from a video signal processing circuit in a control circuit comprising an electronic component or the like mounted on a circuit board (all not illustrated), thereby displaying video including a still image and a moving image. The light representing video displayed on a front surface 4b of the display panel 4 as a display screen passes through the clear and colorless touch panel 3a and is emitted forward. The control circuit of the television apparatus 1 comprises, in addition to the video signal processing circuit, a tuner, a high-definition multimedia interface (HDMI), a signal processor, an audio/video (AV) input terminal, a remote control signal receiver, a controller, a selector, an on-screen display interface, a storage module such as a read only memory (ROM), a random access memory (RAM), and a hard disk drive (HDD), and an audio signal processing circuit (all not illustrated). The television apparatus 1 further comprises a built-in amplifier, speaker, and the like (all not illustrated) for outputting audio.

The touch panel 3a comprises two transparent conductive film adhering each other (not illustrated). The touch panel 3a is conducted at a position pressed by a finger or a stylus, thereby detecting the pressed position. A signal indicating the position pressed on the touch panel 3a is sent to the controller described above. The controller operates according to the signal.

The television apparatus 1 of the first embodiment comprising an excitation mechanism (not illustrated). The excitation mechanism comprises, for example, a motor and an eccentric weight rotated by the motor. The excitation mechanism is attached to a back surface 3f of a rectangular plate-like front wall 3p of the frame 3c. The controller of the television apparatus 1 activates the excitation mechanism when the touch panel 3a is pressed and, for example, vibrates the touch panel unit 3. Accordingly, the operator (user) feels the vibration through his/her finger or a stylus pressing the touch panel 3a, which allows him/her to recognize that the pressing operation has been received.

A strip-like sealing member 6 is arranged along the periphery of the front surface 4b of the display panel 4 between the front surface 4b of the display panel 4 and the back surface 3f of the frame 3c. The sealing member 6 is made of a soft flexible material such as sponge, and prevents foreign matter from getting from the outside into a space S between the front surface 4b of the display panel 4 and the back surface 3b of the touch panel 3a. A repulsive force of the sealing member 6 is set to low to hardly affect the slide or vibration of the touch panel unit 3. That is, the sealing member 6 hardly contributes to the support of the touch panel unit 3 by the housing 2.

The touch panel unit 3 as a front panel is, as illustrated in FIGS. 1 and 2, slidably supported by the housing 2 as a support base through a plurality of slide support mechanisms (combining mechanisms) 7. Relative to the housing 2, the touch panel unit 3 can slide in the front-back direction (a direction perpendicular to the front surface 3e, the vertical direction in FIG. 2) and the horizontal direction (a direction along the front surface 3e, the left-right direction in FIG. 2 and a direction perpendicular to the paper surface). The slide support mechanisms 7 are arranged along the periphery of the touch panel unit 3, preferably, in symmetry with respect to at least one of the two center lines parallel to the four sides of the rectangular touch panel 3a in a front view. The slide support mechanisms 7 are arranged at at least four positions, and supports the frame 3c of the touch panel unit 3.

In the first embodiment, as illustrated in FIG. 2, the slide support mechanisms 7 each comprise a support bracket 2c provided to the housing 2, an elastic bush 8 attached to the support bracket 2c, a through hole 8a formed in the elastic bush 8, a combining portion 7a that passes through the through hole 8a, and a screw 9 configured to be combined with the combining portion 7a as a combined member. In the first embodiment, the support bracket 2c corresponds to a base. The frame 3c corresponds to a periphery member, while the front wall 3p of the frame 3c corresponds to a supported member.

The support bracket 2c is provided as a boss that cylindrically protrudes forward, i.e., toward the front wall 3p as a supported member at the periphery of the bottom wall 2a of the housing 2. A circular through hole 2e is formed in the center of a top wall 2d of the support bracket 2c. An inward-looking flange 2f is formed around the through hole 2e.

Figure 3:
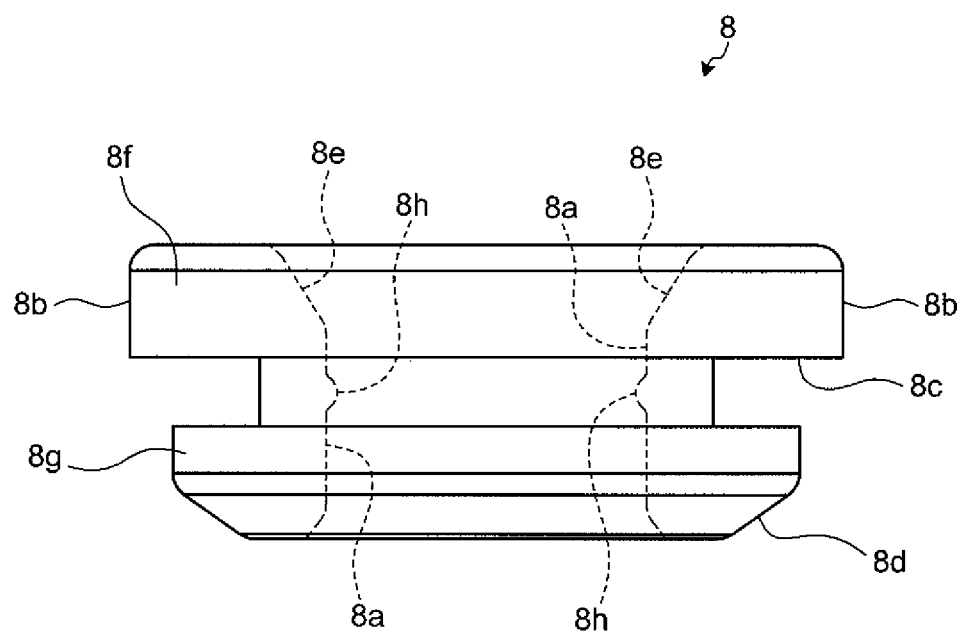
FIG. 3 is an exemplary side view of an elastic bush in the television apparatus in the first embodiment.

The elastic bush 8 is made of an elastic material such as elastomer (for example, synthetic rubber) or the like softer and more flexible than the housing 2 and the frame 3c (the combining portion 7a), and formed in a cylindrical shape. As illustrated in FIGS. 2 and 3, an outer circumference groove 8c is formed in the center of an outer circumference surface 8b in the axial direction (the vertical direction in FIGS. 2 and 3). The outer circumference groove 8c extends all over the outer circumference. The flange 2f of the support bracket 2c is fitted in the outer circumference groove 8c, and thereby the elastic bush 8 is attached to the support bracket 2c.

The elastic bush 8 is elastically deformed. Accordingly, the operator can relatively easily attach the elastic bush 8 to the support bracket 2c by inserting the elastic bush 8 into the through hole 2e from the front side. One side of the elastic bush 8 is asymmetric with the other in the axial direction. This prevents the operator from erroneously assembling the elastic bush 8 with the support bracket 2c. As illustrated in FIGS. 2 and 3, a tapered surface 8d that tapers outward is formed at the periphery of the end of the elastic bush 8 on the side of a head 9a of the screw 9. The tapered surface 8d functions as a guide for inserting the elastic bush 8 into the through hole 2e. Further, as illustrated in FIGS. 2 and 3, a tapered surface 8e that tapers inward is formed at the end of the through hole 8a on the support bracket 2c side. The tapered surface 8e functions as a guide for inserting the combining portion 7a into the through hole 8a. The tapered surface 8e prevents the elastic bush 8, which is pushed when the combining portion 7a is inserted into the through hole 8a, from being wrongly assembled.

The combining portion 7a is formed as a boss cylindrically protruding backward from the frame 3c. As illustrated in FIG. 2, when assembled, the combining portion 7a passes through the through hole 2e of the support bracket 2c and protrudes on the back side (back surface side) of the support bracket 2c. A female screw hole 7b is formed in the combining portion 7a as a female screw portion. The female screw hole 7b opens backward. While, in the first embodiment, the female screw hole 7b is formed as a through hole passing through from the front to the back of the front wall 3p of the frame 3c, it may be formed as a bottomed hole that opens only backward.

The screw 9 comprises the head 9a and a male screw portion 9b threadedly engaged with the female screw hole 7b. The screw 9 is inserted until the head 9a comes in contact with an end 7c of the combining portion 7a.

The operator assembles the elastic bush 8 with the support bracket 2c from the front side, and brings the touch panel unit 3 close to the housing 2 from the front side to insert the combining portion 7a into the through hole 8a of the elastic bush 8. Then, the operator screws the screw 9 into the female screw hole 7b of the combining portion 7a as a boss from the back side, and thereby the slide support mechanisms 7 as illustrated in FIG. 2 are formed. That is, the elastic bush 8 is configured to be fitted with the support bracket 2c. Thus, the operator can perform the assembly work easily and smoothly compared to the case where an elastic member is adhered or screwed.

In the first embodiment, the combining portion 7a passes through the through hole 8a of the elastic bush 8 in the front-back direction of the display panel 4. Accordingly, the operator can insert the combining portion 7a into the through hole 8a by stacking or overlapping the display panel 4 and the touch panel unit 3. Thus, the operator can perform the assembly work more easily and smoothly.

In the first embodiment, as illustrated in FIG. 2, when the slide support mechanisms 7 are assembled, a front-side extension portion 8f of the elastic bush 8 is located between the support bracket 2c as part of the housing 2 and the frame 3c of the touch panel unit 3 in front thereof, and also a back-side extension portion 8g of the elastic bush 8 is located between the support bracket 2c and the screw 9 in the back thereof. That is, the repulsive force of the elastic bush 8 can easily be equally acted with respect to both force (external force, inertial force, etc.) acting from the front to the back of the touch panel unit 3 and force acting from the back to the front. This facilitates to prevent the variation in forward and backward slide (vibration) of the touch panel unit 3. In addition, the elastic bush 8 is arranged to surround the combining portion 7a, which prevents the variation in the horizontal slide characteristic (vibration characteristic) of the touch panel unit 3. From the view of easy slide (vibration), the initial load (the load when no external force except the own weight is acting) on the front-side extension portion 8f and the back-side extension portion 8g by holding the members is preferably set to relatively low.

In the first embodiment, the support bracket 2c is formed as a boss that protrudes forward (i.e., toward the front wall 3p of the frame 3c) from the bottom wall 2a of the housing 2. This prevents the slide support mechanisms 7 from protruding backward from the bottom wall 2a and facilitates to house the slide support mechanisms 7 in the housing 2. Besides, the held elastic bush 8 comes in contact with the front wall 3p of the frame 3c as a base. This eliminates the need to provide the frame 3c with a portion where the elastic bush 8 comes in contact separately from the front wall 3p, and simplifies the structure of the slide support mechanisms 7.

In the slide support mechanisms 7 configured as above, as the contact area between the touch panel unit 3 and the elastic bush 8 increases, the touch panel unit 3 is less likely to vibrate. Thus, the first embodiment provides a structure that reduces the contact area between the touch panel unit 3 and the elastic bush 8 when assembled. For example, a ring-like protrusion 8h is provided on the inner surface of the through hole 8a of the elastic bush 8. The protrusion 8h reduces the contact area between the inner surface of the through hole 8a and the outer surface of the combining portion 7a. For another example, a plurality of protrusions 3g are arranged in a circle at a portion where the back surface 3f of the frame 3c faces the elastic bush 8. The protrusions 3g reduce the contact area between the back surface 3f of the frame 3c and the front surface of the elastic bush 8. These are described by way of example only, and a protrusion may be provided to the combining portion 7a or the front surface of the elastic bush 8. Such a protrusion may be formed in a ring shape, or a plurality of protrusions may be arranged in a circle.

In the first embodiment, the outer diameter Dh of the head 9a is larger than the inner diameter Dp of the through hole 2e of the support bracket 2c. Accordingly, even if the elastic bush 8 cannot be assembled by error or comes off from the support bracket 2c by time degradation or the like, the screw 9 is prevented from coming off from the through hole 2e of the support bracket 2c. This prevents the touch panel unit 3 from coming off from the housing 2. A washer (not illustrated) may be arranged between the head 9a and the elastic bush 8. The washer prevents the elastic bush 8 from twisting upon screwing the screw 9. In this case, the washer is provided with an outer diameter larger than the inner diameter Dp of the through hole 2e.

As described above, according to the first embodiment, the touch panel unit 3 comprising the touch panel 3a is slidably supported by the housing 2 via the plurality of slide support mechanisms 7 having the elastic bush 8. If the panel unit is supported by the housing via insulators arranged in a ring, this results in a large contact area between the panel unit and the insulators as elastic members. Consequently, the panel unit poorly slides (vibrates). In the first embodiment, the touch panel unit 3 is supported by the housing 2 via the slide support mechanisms 7 having the elastic bush 8. Accordingly, the contact area between the elastic member and the panel unit is relatively small. This allows the touch panel unit 3 to easily slide (vibrate). That is, according to the first embodiment, the touch panel unit 3 can be flexibly supported by the slide support mechanisms 7. Thus, the touch panel unit 3 can be effectively vibrated by the excitation mechanism, and also, if an external force is applied to the touch panel unit 3 toward the back side (the display panel 4 side) when, for example, pressed with a finger or the like, the touch panel unit 3 and the touch panel 3a is not likely to be damaged.

According to the first embodiment, the slide support mechanisms 7 comprise the elastic bush 8 having the through hole 8a and the periphery is fitted in one of the housing 2 and the touch panel unit 3 (in the first embodiment, as an example, the housing 2), and the screw 9 connected to the other one of the housing 2 and the touch panel unit 3 (in the first embodiment, as an example, the touch panel unit 3) via the combining portion 7a passing through the through hole 8a and holding the elastic bush 8 with the other one. Accordingly, the elastic bush 8 can be attached to the one of the housing 2 and the touch panel unit 3 (in the first embodiment, the housing 2) by fit connection. Thus, compared to the case where the elastic member is attached by adhesion or screwing, the operator can perform assembly work more easily and smoothly. Besides, the elastic bush 8 is arranged to surround the combining portion 7a. This prevents the variation in the slide characteristic (vibration characteristic) of the touch panel unit 3 in each direction perpendicular to the through hole 8a. Further, the elastic bush 8 supported by the one of the housing 2 and the touch panel unit 3 (in the first embodiment, the housing 2) at the periphery is held by the other one of the housing 2 and the touch panel unit 3 (in the first embodiment, the touch panel unit 3) and the screw 9 connected to the other one. Thus, the repulsive force of the elastic bush 8 can easily be equally acted with respect to both axial directions of the through hole 8a. This prevents the variation in the slide characteristic (vibration characteristic) in both the directions.

According to the first embodiment, the elastic bush 8 of the slide support mechanisms (combining mechanism) 7 has the function of preventing the touch panel unit 3 from sliding in the in-plane direction of a front surface 23e (the direction along the XY plane) and the out-of-plane direction (the direction crossing the XY plane, at least the Z direction, the front-back direction). That is, as illustrated in FIG. 2, the elastic bush 8 is arranged to cover the periphery of the flange 2f as an example of a portion integrated with the housing 2, and portions integrated with the touch panel unit 3 (for example, the front wall 3p, the combining portion 7a, and the head 9a) are arranged to cover the periphery of the elastic bush 8. Accordingly, if the touch panel unit 3 is displaced in any direction, the elastic bush 8 is present between the housing 2 and the touch panel unit 3. Thus, with the elastic bush 8 as a preventing member, it is possible to prevent the over displacement of the touch panel unit 3 or suppress the displacement within a predetermined range.

According to the first embodiment, the touch panel unit 3 comprises the frame 3c located at the periphery of the touch panel 3a. The elastic bush 8 is located on the side of the display panel 4 and on the back of the frame 3c. The combining portion 7a passes through the through hole 8a in the front-back direction of the display panel 4. With this, the elastic bush 8 can be effectively arranged using a space on the back of the frame 3c and on the side of the display panel 4. Besides, by only stacking or overlapping the display panel 4 and the touch panel unit 3 in the front-back direction, the operator can achieve the state where the combining portion 7a passes through the through hole 8a of the elastic bush 8. Thus, the operator can perform the assembly work more easily and smoothly.

According to the first embodiment, the elastic bush 8 is supported by the housing 2. The screw 9 comprises the head 9a and the male screw portion 9b. The combining portion 7a comprises the boss having the female screw hole 7b protruding from the front wall 3p of the frame 3c toward the back surface 3f, which is threadedly engaged with the male screw portion 9b. The elastic bush 8 is held between the head 9a and the frame 3c. That is, the combining portion 7a passing through the through hole 8a of the elastic bush 8 can be used as a boss for screwing the screw 9, which downsizes the portion for screwing the screw 9. Further, a relatively simple and small structure, in which members (the frame 3c and the combining portion 7a) fixed to the touch panel unit 3 holds the elastic bush 8 supported by the housing 2 in the axial direction of the through hole 8a, can be achieved.

According to the first embodiment, in at least one of the contact portion between the elastic bush 8 and the frame 3c and that between the elastic bush 8 and the combining portion 7a (in the first embodiment, both of them), at least one of members in contact with each other (in the first embodiment, the elastic bush 8 and the frame 3c) has the protrusion 8h or 3g. This reduces the contact area between the touch panel unit 3 and the elastic bush 8 and allows the touch panel unit 3 to vibrate easily.

Figure 4:
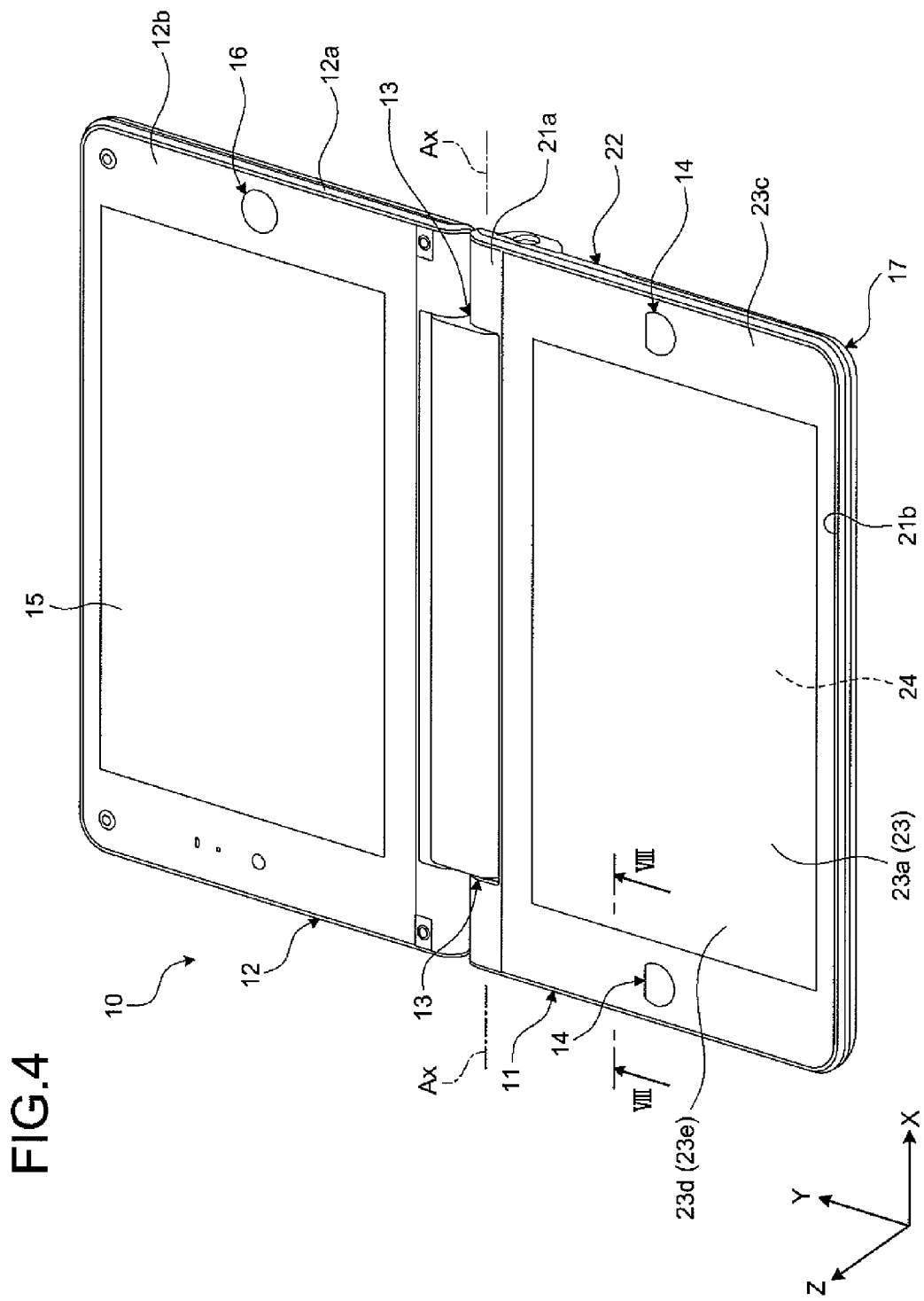
FIG. 4 is an exemplary perspective view of an electronic device according to a second embodiment.

A description will be given of an electronic device 10 according to a second embodiment. As illustrated in FIG. 4, the electronic device 10 of the second embodiment is, for example, a notebook personal computer. The electronic device 10 comprises a flat rectangular first body 11 and a flat rectangular second body 12. The first body 11 and the second body 12 are connected by a hinge mechanism 13 to be relatively rotatable about a rotation axis Ax between an open position as illustrated in FIG. 4 and a closed position (not illustrated). Hereinafter, for the sake of convenience of description, directions (X, Y, and Z directions) are defined. The X and Y directions are the directions substantially along the front surface of the first body 11. The X direction refers to the width direction of the first body 11 (the longitudinal direction of the front surface), the Y direction refers to the depth direction of the first body 11 (the short-side direction of the front surface), and the Z direction refers to the direction perpendicular to the surface of the first body 11. The X, Y, and Z directions are perpendicular to one another.

The first body 11 is provided with a display panel 24 such as a liquid crystal display (LCD) panel as a display device provided with a touch panel 23a, a push button 14, and the like, which are exposed on a front surface 21a as the outer surface of a housing 22. On the other hand, the second body 12 is provided with a display panel 15 such as LCD panel as a display device, a pointing device 16, and the like, which are exposed on a front surface 12b as the outer surface of a housing 12a. When the first body 11 and the second body 12 are in the open position as illustrated in FIG. 4, the display panel 15, the display panel 24 with the touch panel 23a, the push button 14, the pointing device 16, and the like are exposed to allow the user to use them. On the other hand, in the closed position, the front surface 21a closely faces the front surface 12b, and the display panels 15 and 24, the push button 14, the pointing device 16, and the like are covered between the housings 22 and 12a. While, in the second embodiment, the touch panel 23a will be described by way of example as being provided to only the first body 11, a touch panel may be provided to the second body 12. In the second embodiment, the touch panel 23a corresponds to a front panel, and the housing 22 corresponds to a support base.

Figure 5:
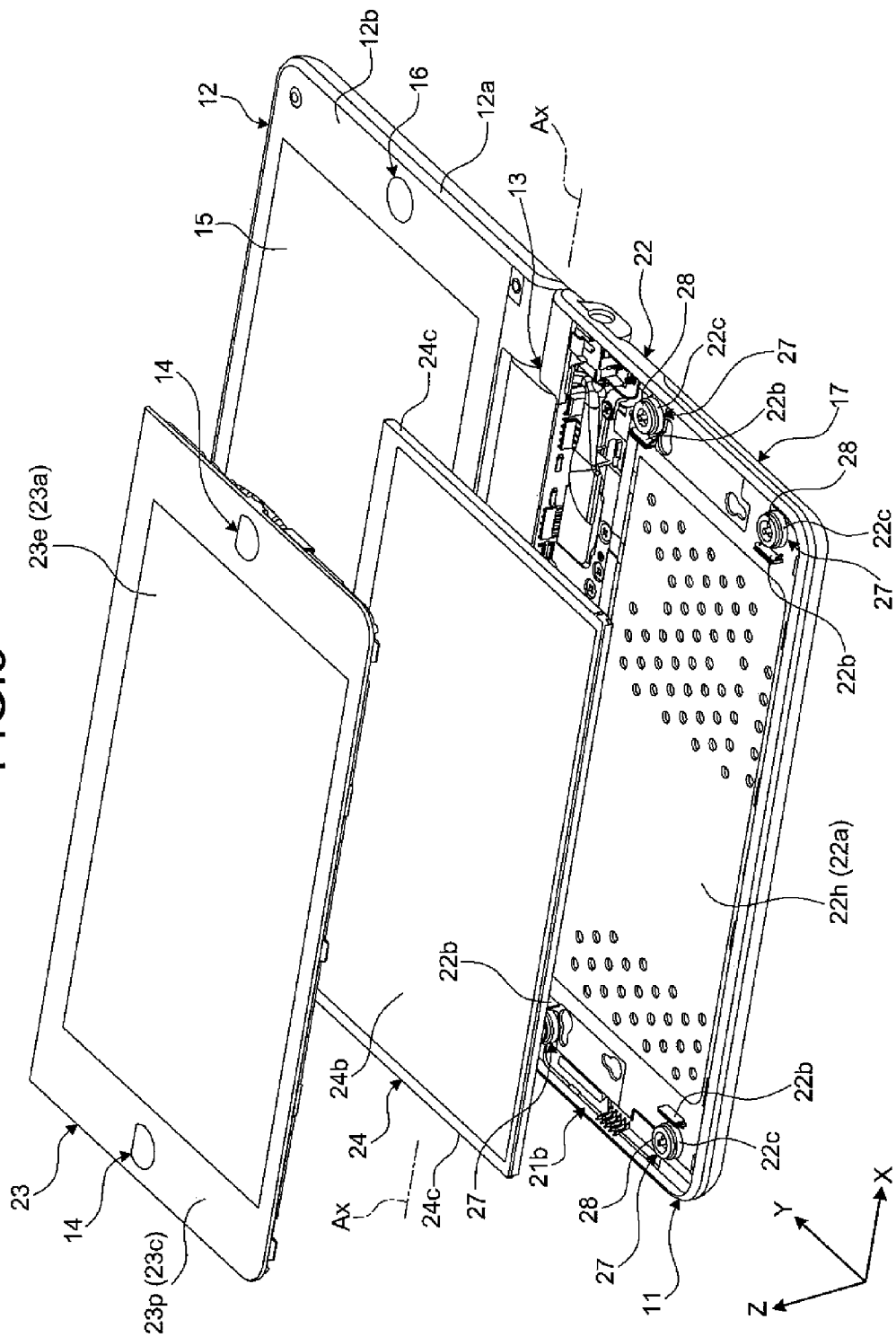
FIG. 5 is an exemplary exploded perspective view of the electronic device in the second embodiment.

As illustrated in FIG. 5, in the second embodiment, the display panel 24 is located on a bottom wall 22a of the housing 22 of the first body 11. A touch panel unit 23 is arranged on the display panel 24. In the second embodiment, the front-back direction based on the display panel 24 corresponds to the Z direction. The upper side of FIGS. 9 and 5 corresponds to the front side, and the lower side corresponds to the back side. The touch panel 23a corresponds to the panel unit.

As illustrated in FIGS. 4 and 5, the housing 22 is provided with an opening 21b that opens forward (upward in the Z direction). The opening 21b is covered with the touch panel unit 23. The first body 11 has no front wall as a wall on the front side of the housing 22 except at the periphery on the second body 12 side where part of the hinge mechanism 13 is housed. The front surface of the first body 11 is almost formed of the front surface 23e of the touch panel unit 23. Substantially a constant clearance 21c (see FIG. 8) is provided along the entire circumference of the touch panel unit 23 between the touch panel unit 23 and the opening 21b.

Figure 6:
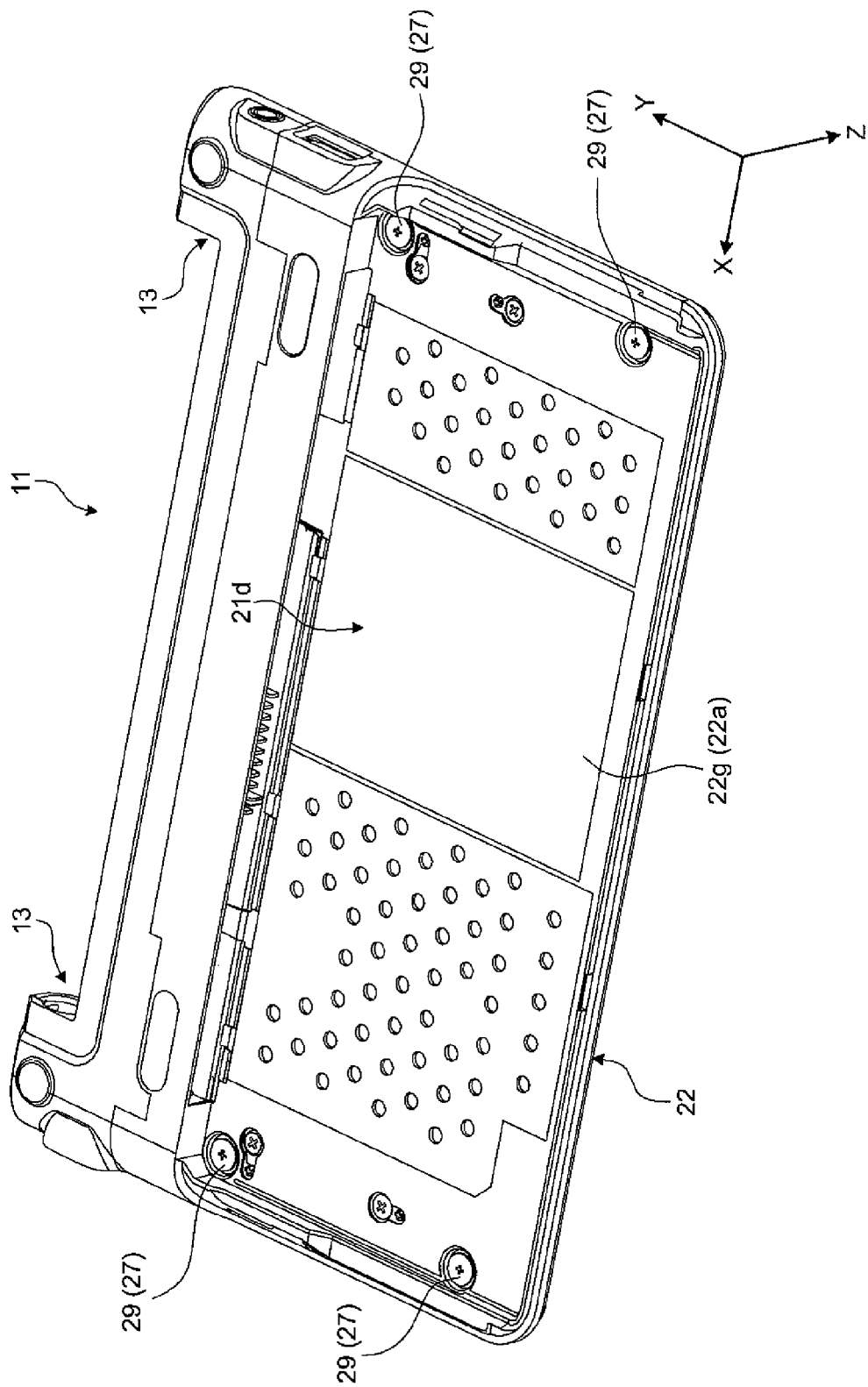
FIG. 6 is an exemplary perspective view of the back side of a first body of the electronic device where a battery pack is removed in the second embodiment.
Figure 8:
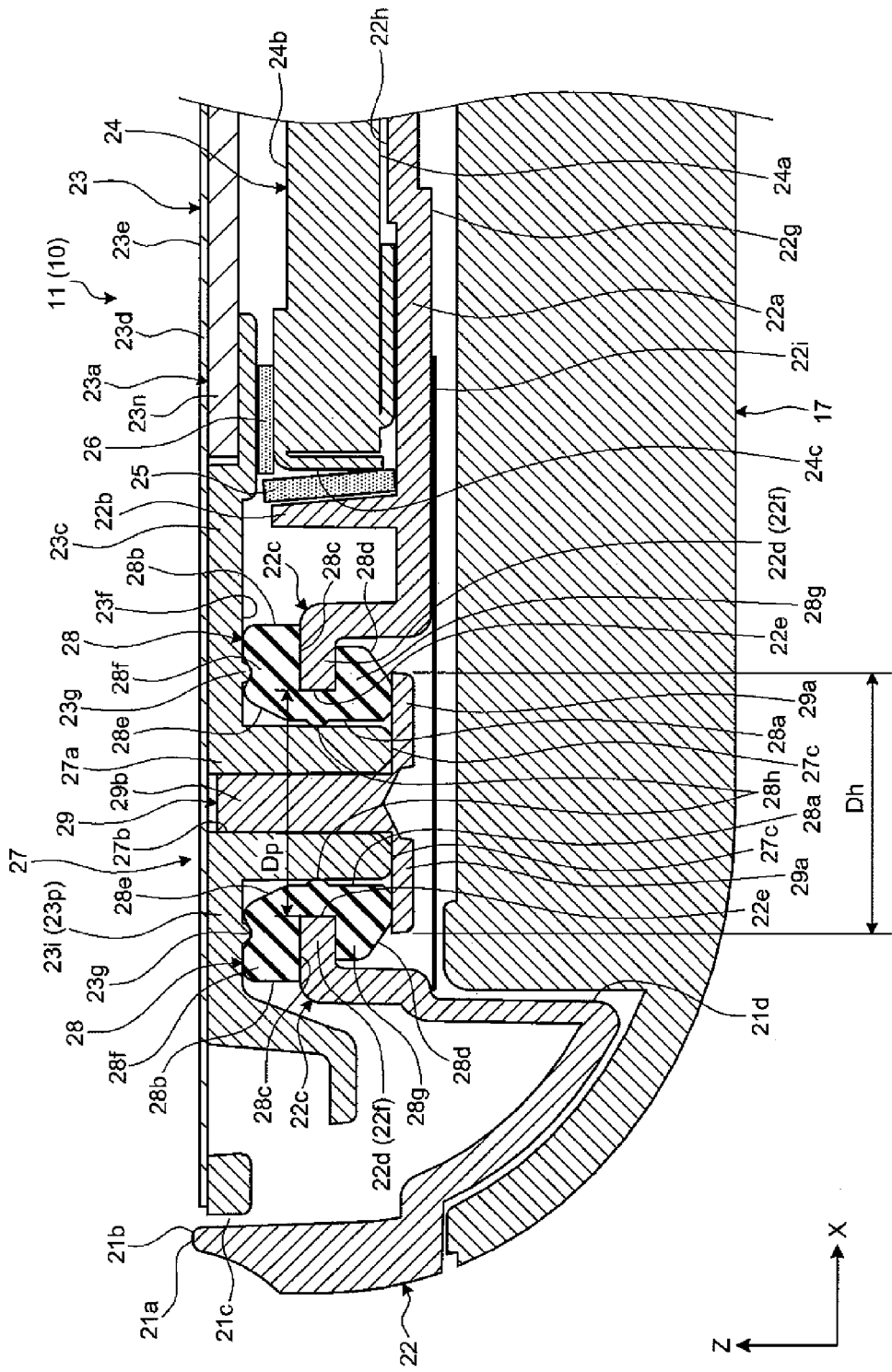
FIG. 8 is an exemplary cross-sectional view taken along line VIII-VIII of FIG. 4 in the second embodiment.

As illustrated in FIG. 6, on the back of the housing 22 of the first body 11, a recessed portion 21d, in which a flat rectangular parallelepiped battery pack 17 (see FIGS. 4, 5, and 8) is fitted, is formed. The recessed portion 21d is formed on the side separate from the hinge mechanism 13, i.e., near the back in the depth direction (the Y direction). The bottom surface of the recessed portion 21d is a back surface 22g of the bottom wall 22a. That is, in the second embodiment, the bottom wall 22a of the housing 22 functions as a partition wall between an inner space of the housing 22 that houses the display panel 24 and the touch panel unit 23 and the recessed portion 21d that houses the battery pack 17. The display panel 24 is, as illustrated in FIG. 8, fixed to the bottom wall 22a facing a back surface 24a with a screw (not illustrated) or the like.

As illustrated in FIG. 5, in the bottom wall 22a, the display panel 29 is mounted on the front surface 22h. Besides, a portion where the battery pack 17 is located on the back surface 22g as illustrated in FIG. 6 protrudes more forward than a portion on the hinge mechanism 13 side as illustrated in FIG. 5. A plurality of (in the second embodiment, four) vertical walls 22b are provided to the protruding portion. The vertical walls 22b are formed as ribs having a rectangular appearance in a side view. The vertical walls 22b extend from the bottom wall 22a toward the front side (upper side in FIG. 5) and faces a side surface 24c corresponding to the short side of the display panel 24. In the second embodiment also, the vertical walls 22b function as a positioning member to attach the display panel 24 to the housing 22 or a shock or energy absorbing member for a shock load acting in the horizontal direction on the display panel 24 and the like. In the second embodiment, two of the vertical walls 22b are arranged to face the one side surface 24c corresponding to the short side, and a total of the four vertical walls 22b are provided on the bottom wall 22a.

As illustrated in FIG. 5, in the bottom wall 22a, the display panel 24 is mounted on the front surface 22h. Besides, on the front surface 22h in the portion where the battery pack 17 is located on the back surface 22g as illustrated in FIG. 6, a plurality of cylindrical bottomed support brackets 22c that constitute a slide support mechanisms 27 protrude as illustrated in FIG. 5. In the second embodiment, the support brackets 22c (in the second embodiment, four support brackets) are located outside the vertical walls 22b in the width direction. The elastic bush 28 is attached to each of the support brackets 22c.

As illustrated in FIG. 5, the display panel 24 is formed into a flat rectangular parallelepiped shape. The display panel 24 receives a display signal from a control circuit comprising an electronic component or the like mounted on a circuit board (all not illustrated), thereby displaying video including a still image and a moving image. In the second embodiment also, the light representing video displayed on a front surface 24b of the display panel 24 as a display screen passes through the clear and colorless touch panel 23a and is emitted forward. The control circuit of the electronic device 10 comprises a control module, a storage module such as ROM, RAM, and HDD, an interface circuit, and various controllers (all not illustrated). The electronic device 10 further comprises a built-in speaker (not illustrated) and the like for outputting audio.

Figure 7:
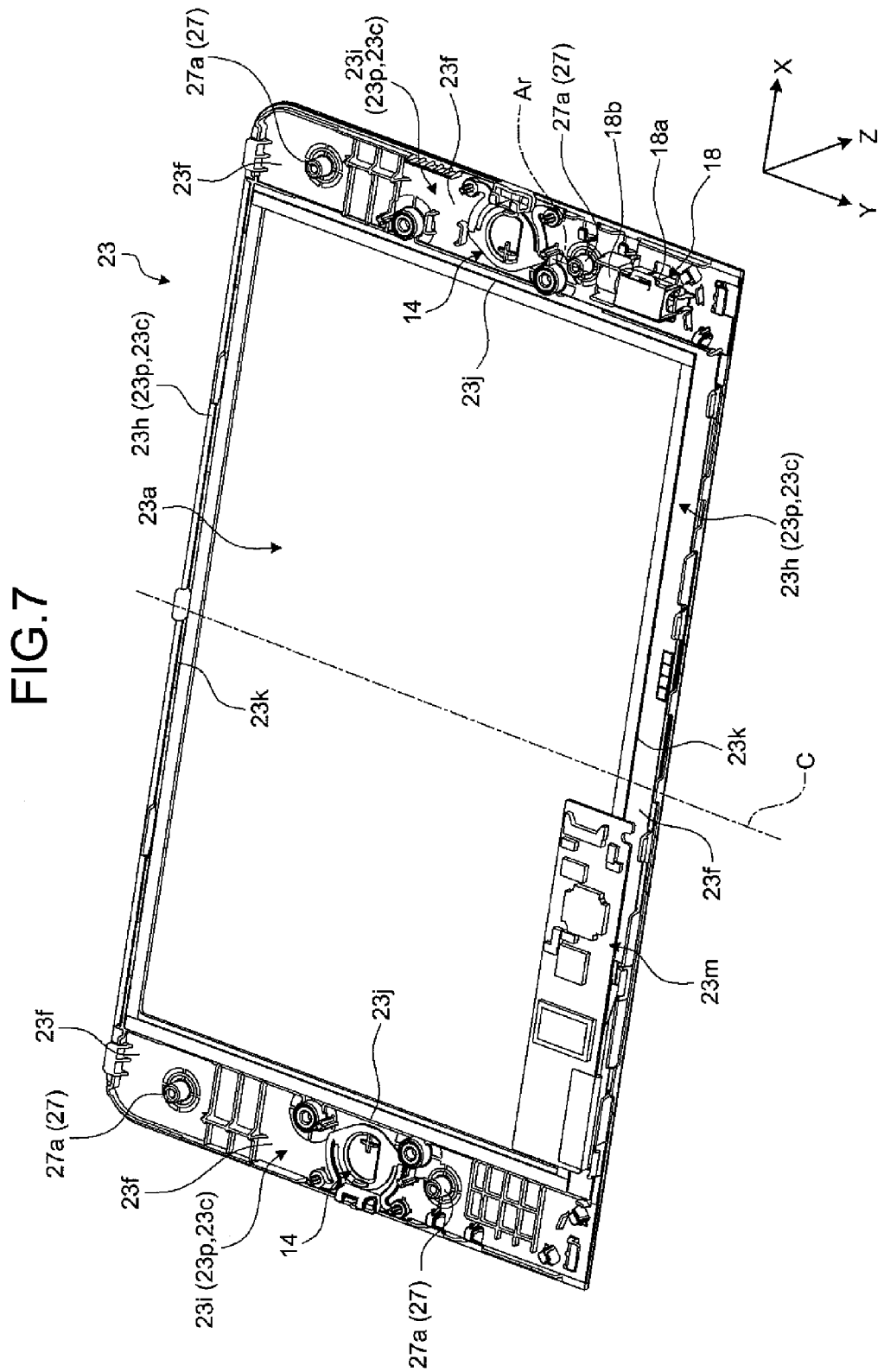
FIG. 7 is an exemplary perspective view of the back side of a touch panel unit of the electronic device in the second embodiment.

As illustrated in FIGS. 5 and 7, the touch panel unit 23 comprises the rectangular sheet-like touch panel 23a and the rectangular frame 23c arranged along the periphery of the touch panel 23a. The frame 23c is made of a synthetic resin material, a metal material, or the like. As illustrated in FIG. 8, the touch panel 23a and the frame 23c are attached to a transparent cover 23d by double-sided tape (not illustrated), adhesive, or the like. The cover 23d is made of a thin sheet-like, film-like, or plate-like synthetic resin material or the like. Through the cover 23d, the touch panel 23a is integrated with the frame 23c. A periphery 23n of the touch panel 23a is located between the frame 23c and the cover 23d. The periphery of the cover 23d is painted black or the like, and prevents the periphery 23n of the touch panel 23a and the frame 23c from being exposed on the side of the front surface 23e of the touch panel unit 23 (upper side in FIG. 8). In the second embodiment also, as illustrated in FIG. 8, there are provided an elastic member 25 having the same function as the elastic member 5 and a sealing member 26 having the same function as the sealing member 6.

As illustrated in FIG. 5, the frame 23c has a rectangular plate-like front wall 23p. In addition, as illustrated in FIG. 7, the frame 23c comprises horizontal portions 23h on both sides in the depth direction and vertical portions 23i on both sides in the width direction as a strip-like portion arranged along the periphery of the touch panel 3a. In the second embodiment, a combining portion 27a that constitutes the slide support mechanisms 27 is provided on a back surface 23f of the front wall 23p of the vertical portions 23i wider than the horizontal portions 23h. In the second embodiment, the combining portion 27a is provided to two positions of each of the two vertical portions 23i, i.e., a total of four positions. In other words, in the second embodiment, the four slide support mechanisms 27 support the touch panel unit 23.

An excitation mechanism 18 is provided on the back surface 23f of the front wall 23p of one of the vertical portions 23i (the vertical portion 23i on the right side in FIG. 7). In the second embodiment, the excitation mechanism 18 comprises a motor 18a and an eccentric weight 18b rotated by the motor 18a. The rotation of the eccentric weight 18b rotated by the motor 18a vibrates (rotates) the gravity center of the excitation mechanism 18. This vibrates the touch panel unit 23 as well as the frame 23c.

As illustrated in FIG. 7, the rotation axis Ar of the eccentric weight 18b of the excitation mechanism 18 extends along a short side 23j of the rectangular touch panel 23a in a front view. Accordingly, the excitation direction of the excitation mechanism 18 is perpendicular to the short side 23j, and the excitation mechanism 18 is capable of vibrating the touch panel unit 23 in the direction along a long side 23k. If the excitation mechanism 18 vibrates the touch panel unit 23 in the direction along the short side 23j, i.e., the Y direction, this increases the distance (i.e., moment arm) between the excitation mechanism 18 and each of the combining portions 27a as a support point of the touch panel unit 23 in the X direction and the variation thereof. Consequently, the touch panel unit 23 is likely to slide in the in-plane direction (i.e., in the XY plane). In this case, the vibration is likely to vary substantially depending on the position of the touch panel 23a. According to the second embodiment, the excitation mechanism 18 vibrates the touch panel unit 23 in the direction perpendicular to the short side 23j, i.e., the direction along the long side 23k. This reduces the distance (i.e., moment arm) between the excitation mechanism 18 and each of the combining portions 27a in the Y direction and the variation thereof. Thus, the touch panel unit 23 is not likely to slide in the in-plane direction (i.e., in the XY plane). In other words, it is possible to easily achieve the vibration of the touch panel 23a along the longitudinal direction (i.e., the X direction) in which slide components are less.

The eccentric weight 18b of the excitation mechanism 18 is located closer to the center of the short side 23j than the motor 18a. This makes the excitation point of the excitation mechanism 18 closer to the gravity center of the touch panel unit 23.

Thus, the touch panel unit 23 can be effectively vibrated. Besides, compared to the case where the eccentric weight 18b is located more distant from the center of the short side 23j than the motor 18a, the touch panel unit 23 is not likely to slide in the in-plane direction (i.e., in the XY plane). In other words, it is possible to easily achieve the vibration along the longitudinal direction (i.e., the X direction) in which slide components are less.

As described above, according to the second embodiment, the battery pack 17 is located on the side distant from the hinge mechanism 13 (i.e., on the back side in the depth direction). On the other hand, the excitation mechanism 18 is located close to the hinge mechanism 13 (i.e., on the front side in the depth direction). That is, in the second embodiment, the battery pack 17 and the excitation mechanism 18 are effectively arranged in the housing 22 of the first body 11 without interference with each other.

As illustrated in FIG. 7, the push button 14 is located on the back surface 23f of the front wall 23p of the vertical portions 23i of the frame 23c. In the second embodiment, the push button 14 is located in the center of the vertical portions 23i in the longitudinal direction (the Y direction), and the combining portions 27a, i.e., the slide support mechanisms 27, are located on both sides of the vertical portions 23i in the longitudinal direction with the push button 14 between them. The push button 14 and the combining portions 27a (i.e., the slide support mechanisms 27) are arranged symmetrical with respect to a center line C passing through the center of the touch panel unit 23 in the X direction along the Y direction. A circuit board 23m mounted with an electronic component for the processing of the touch panel 23a is attached on the back surface 23f of the front wall 23p of the horizontal portions 23h on the hinge mechanism 13 side of the touch panel 23a. The circuit board 23m is located on the vertical portion 23i opposite (the left side in FIG. 7) the vertical portion 23i provided with the excitation mechanism 18 (the vertical portion 23i on the right side in FIG. 7).

As illustrated in FIG. 8, the electronic device 10 of the second embodiment comprises the slide support mechanisms 27 having the same function as the slide support mechanisms 7 of the first embodiment. That is, the slide support mechanisms 27 each comprise the support bracket 22c provided to the housing 22, the elastic bush 28 attached to the support bracket 22c, a through hole 28a formed in the elastic bush 28, the combining portion 27a that passes through the through hole 28a, and a screw 29 configured to be combined with the combining portion 27a as a combined member. In the second embodiment, the support bracket 22c corresponds to a base. The frame 23c corresponds to a periphery member, while the front wall 23p of the frame 23c corresponds to a supported member.

The support bracket 22c is provided as a boss that cylindrically protrudes forward, i.e., toward the front wall 23p, as a supported member at the periphery of the bottom wall 22a of the housing 22. A circular through hole 22e is formed in the center of a top wall 22d of the support bracket 22c. An inward-looking flange 22f is formed around the through hole 22e.

The elastic bush 28 is made of an elastic material such as elastomer (for example, synthetic rubber) or the like, and formed in a cylindrical shape. An outer circumference groove 28c is formed in the center of an outer circumference surface 28b of the elastic bush 28 in the axial direction (the vertical direction in FIG. 8). The outer circumference groove 28c extends all over the outer circumference. The flange 22f of the support bracket 22c is fitted in the outer circumference groove 28c, and thereby the elastic bush 28 is attached to the support bracket 22c.

The elastic bush 28 is elastically deformed. Accordingly, the operator can relatively easily attach the elastic bush 28 to the support bracket 22c by inserting the elastic bush 28 into the through hole 22e from the front side. One side of the elastic bush 28 is asymmetric with the other in the axial direction. This prevents the operator from erroneously assembling the elastic bush 28 with the support bracket 22c. As illustrated in FIG. 8, as with the elastic bush 8 of the first embodiment, the tapered surfaces 28d and 28e are formed in the elastic bush 28. Besides, as with the elastic bush 8 of the first embodiment, the elastic bush 28 comprises a front-side extension portion 28f located between the frame 23c and the flange 22f, and a back-side extension portion 28g located between a head 29a of the screw 29 and the flange 22f.

The combining portion 27a is formed as a boss cylindrically protruding backward from the frame 23c. As illustrated in FIG. 8, when assembled, the combining portion 27a passes through the through hole 22e of the support bracket 22c and protrudes on the back side (back surface side) of the support bracket 22c. A female screw hole 27b opening backward is formed in the combining portion 27a as a female screw portion.

The screw 29 comprises the head 29a and a male screw portion 29b configured to be threaded into the female screw hole 27b. The screw 29 is inserted into the combining portion 27a until the head 29a comes in contact with an end 27c of the combining portion 27a.

The operator assembles the elastic bush 28 with the support bracket 22c from the front side, and brings the touch panel unit 23 close to the housing 22 from the front side to inset the combining portion 27a into the through hole 28a of the elastic bush 28. Then, the operator screws the screw 29 into the female screw hole 27b of the combining portion 27a as a boss from the back side, and thereby the slide support mechanisms 27 as illustrated in FIG. 8 are formed. That is, the elastic bush 28 is configured to be fitted with the support bracket 22c. Thus, the operator can perform the assembly work easily and smoothly compared to the case where an elastic member is adhered or screwed.

In the second embodiment, as in the first embodiment, the combining portion 27a passes through the through hole 28a of the elastic bush 28 in the front-back direction of the display panel 24. Besides, in the second embodiment also, when the slide support mechanisms 27 are assembled, the front-side extension portion 28f of the elastic bush 28 is located between the support brackets 2c as part of the housing 22 and the frame 23c of the touch panel unit 23 in front thereof, and also the back-side extension portion 28g of the elastic bush 28 is located between the support bracket 22c and the screw 29 in the back thereof. In addition, the elastic bush 28 is arranged to surround the combining portion 27a. In the second embodiment also, the support bracket 22c is formed as a boss that protrudes forward (i.e., toward the front wall 23p of the frame 23c) from the bottom wall 22a of the housing 22.

The second embodiment also provides a structure that reduces the contact area between the touch panel unit 23 and the elastic bush 28 when assembled. In the structure, a ring-like protrusion 28h is provided on the inner surface of the through hole 28a of the elastic bush 28, and a plurality of protrusions 23g are arranged in a circle at a portion of the back surface 23f of the frame 23c faces the elastic bush 28. These are described by way of example only, and a protrusion may be provided to the combining portion 27a or the front surface of the elastic bush 8, such a protrusion may be formed in a ring shape, or a plurality of protrusions may be arranged in a circle.

As illustrated in FIG. 6, in the second embodiment, the screw 29 that constitutes the slide support mechanisms 27 is exposed on the back surface 22g side of the bottom wall 22a. That is, before screwing the screw 29, the end 27c (see FIG. 8) of the combining portion 27a that constitutes the slide support mechanisms 27 is exposed on the back surface 22g side of the bottom wall 22a. Accordingly, by screwing the screw 29 when the battery pack 17 is not fitted in the recessed portion 21d, the slide support mechanisms 27 can be easily and smoothly obtained, and the touch panel unit 23 can be attached to the housing 22. Further, by covering the screw 29 with the battery pack 17, it is possible to prevent the touch panel unit 23 from being detached from the housing 22 caused by the user erroneously unscrewing the screw 29. With this, compared to the case where the cover is separately provided to cover the screw 29, the structure can be simplified. As illustrated in FIG. 8, a seal 22i may be attached to the back surface 22g as an example of a cover to cover the screw 29 therewith. Furthermore, in the second embodiment, the housing 22 can be made thinner by using the battery pack 17 as the cover of the recessed portion 21d.

As described above, according to the second embodiment, the electronic device 10 comprises the slide support mechanisms 27 having the same function as the slide support mechanisms 7 of the first embodiment although with different specifications such as the size, number, location, and the like. That is, the electronic device 10 of the second embodiment provided with the slide support mechanisms 27 can achieve the same effect as the television apparatus 1 of the first embodiment provided with the slide support mechanisms 7. Besides, the elastic bush 28 of the slide support mechanisms 27 functions as a preventing member in the same manner as the elastic bush 8 of the slide support mechanisms 7 of the first embodiment functioning as a preventing member.

According to the second embodiment, the excitation mechanism 18 is provided to the back surface side of the front wall 23p of the frame 23c. Accordingly, compared to the case where the excitation mechanism 18 is provided to the housing 22 or the like, the touch panel unit 23 can be effectively vibrated.

In the second embodiment, the excitation mechanism 18 comprises the eccentric weight 18b and the motor 18a that rotates the eccentric weight 18b. Thus, the excitation mechanism 18 can be simplified and formed with less cost.

According to the second embodiment, the touch panel 23a is rectangular in a front view (viewed from the front). The excitation direction of the excitation mechanism 18 is perpendicular to the short side 23j of the touch panel 23a. More specifically, the rotation axis Ar of the eccentric weight 18b or the motor 18a extends along the short side 23j of the rectangular touch panel 23a. Accordingly, compared to the case where the excitation direction of the excitation mechanism 18 is along the short side 23j or the rotation axis Ar of the motor 18a is along the long side 23k, the touch panel unit 23 is not likely to slide in the in-plane direction (i.e., in. the XY plane). In other words, it is possible to easily achieve the vibration along the longitudinal direction in which slide components are less.

According to the second embodiment, the eccentric weight 18b is located closer to the center of the short side 23j than the motor 18a. This makes the excitation point closer to the gravity center of the touch panel unit 23. Thus, the touch panel unit 23 can be effectively vibrated. Besides, compared to the case where the eccentric weight 18b is located more distant from the center of the short side 23j than the motor 18a, the touch panel unit 23 is not likely to slide in the in-plane direction (i.e., in the XY plane). In other words, it is possible to easily achieve the vibration along the longitudinal direction in which slide components are less.

The foregoing embodiments are susceptible to considerable variation in their practice. For example, the embodiments are described above as being applied to the television apparatus or the notebook personal computer provided with two display screens, the embodiments may be applied to any other electronic device having a display panel and a front panel in front of the display panel such as a notebook or desktop computer with one display screen, a personal digital assistant (ETA), a smartbook, a smartphone, a mobile phone, and the like.

Besides, the specifications (motion system, structure, form, material, size, number, arrangement, etc.) can be changed as required for the display device, the electronic device, the display panel, the front panel, the panel unit, the support base, the periphery member, the slide support mechanism, the through portion, the elastic bush, the combining portion, the combined member, the frame, the excitation mechanism, the protrusion, and the like. For example, the front panel need not necessarily be a touch panel. In addition, the support base may be a member other than the housing such as, for example, a member that constitutes the basis of the device main body. The periphery member may be provided to part of the periphery of the front panel, and need not necessarily surround the periphery in a frame-like manner. The excitation mechanism may be a mechanism with a linear motor. An element other than the screw, such as a rivet or the like, may be used as the combining portion. Further, using a nut as the combined member, the male screw portion may be provided to the end of the combining portion so that the nut is tightened thereon.

Although not illustrated, preferably, the excitation mechanism is provided between a plurality of slide support mechanisms. With this, the excitation mechanism can be arranged closer to the gravity center of the touch panel unit, and the touch panel unit can be effectively swung (vibrated). Moreover, it can be made easier to suppress the variation in slide (vibration) depending on the location of the touch panel unit and to suppress the slide (vibration) of the touch panel unit in the in-plane direction.

Although not illustrated, a portion where the elastic bush extends in the outer diameter direction (in the above embodiments, for example, the front-side extension portions 8f and 28f, and the back-side extension portions 8g and 28g, etc.) may be brought into contact with the housing (for example, the side wall) to obtain a structure that ensures or adjusts the clearance between the touch panel unit and the surrounding housing (opening periphery). In this case, it is suitable to arrange the slide support mechanisms close to the periphery of the touch panel unit. Moreover, using the contact structure, the touch panel unit can be centered. Besides, a portion where the elastic bush extends toward the side as being held between the support bas and the touch panel unit may be brought into contact with the housing (for example, the side wall).

One of the supporting member and the supported member may comprise an inward-looking flange that extends from the outer circumference of the elastic bush toward the inner circumference, and the elastic bush may be located on the inner circumference side of the inward-looking flange and on both sides in the axial direction (for example, cover while surrounding). Each element integrated with the other of the supporting member and the supported member may be located on the inner circumference side of the elastic bush and on both sides in the axial direction (for example, cover while surrounding). In this case, the elastic bush functions as a preventing member.

Although not illustrated, a portion integrated with one of the supporting member and the supported member may comprise an outward-looking flange that extends toward the outer circumference, and the elastic bush may be located on the outer circumference side of the outward-looking flange and on both sides in the axial direction (for example, cover while surrounding). Each element integrated with the other of the supporting member and the supported member may be located on the outer circumference side of the elastic bush and on both sides in the axial direction (for example, cover while surrounding). In this case also, the elastic bush functions as a preventing member. In addition, the elastic bush may comprise a plurality of divisional bodies.

The sealing member (in the above embodiments, for example, the sealing members 6 and 26, etc.) may be made of an elastic material such as elastomer, sponge, or the like to suppress the slide of the touch panel unit.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An electronic device comprising:
   a supporting member;
   a display provided to the supporting member, the display comprising a display screen;
   a panel unit comprising a panel configured to cover the display screen;
   a combining mechanism configured to combine the supporting member with the panel unit such that the panel unit is supported in a displaceable manner with respect to the supporting member; and
   a preventing member located between the panel unit and the supporting member and between the combining mechanism and the supporting member, and configured to suppress displacement of the panel unit with respect to the supporting member,
   wherein:
   a through portion is formed in the preventing member, a circumference portion of the preventing member is fitted in either the supporting member or the panel unit, and
   the combining mechanism comprises a combined member configured to be combined with either the panel unit or the supporting member via a combining portion passing through the through portion, and configured to hold the preventing member with either the panel unit or the supporting member.

2. The electronic device of claim 1, wherein
   the panel unit comprises a periphery member provided to at least part of a periphery of the panel,
   the preventing member is located on a side of the display and behind the periphery member, and
   the combining portion is configured to pass through the through portion in a front-back direction of the display.

3. The electronic device of claim 2, wherein
   the preventing member is configured to be supported by the supporting member,
   the combined member comprises a head and a male screw portion,
   the combining portion comprises a boss comprising a female screw portion, wherein the female screw portion protrudes backward from the periphery member and threadedly engages with the male screw portion, and
   the preventing member is configured to be held between the head and the periphery member.

4. The electronic device of claim 3, wherein, at at least one of a contact portion between the preventing member and the periphery member and a contact portion between the preventing member and the combining portion, a protrusion is provided to at least one of the members which interfere with each other.

5. The electronic device of claim 2, further comprising an excitation mechanism located behind the periphery member.

6. The electronic device of claim 5, wherein the excitation mechanism comprises an eccentric weight and a motor configured to rotate the eccentric weight.

7. The electronic device of claim 5, wherein:
   the panel comprises a rectangle shape in a front view, and
   an excitation direction of the excitation mechanism is perpendicular to a short side of the rectangle shape of the panel.

8. The electronic device of claim 6, wherein:
   the panel comprises a rectangle shape in a front view, and
   a rotation axis of the eccentric weight extends along a short side of the rectangle shape of the panel.

9. The electronic device of claim 8, wherein the eccentric weight is located closer to the center of the short side than is the motor.

\* \* \* \* \*